US008679912B2

(12) United States Patent
Kang et al.

(10) Patent No.: US 8,679,912 B2
(45) Date of Patent: Mar. 25, 2014

(54) SEMICONDUCTOR DEVICE HAVING DIFFERENT NON-VOLATILE MEMORIES HAVING NANOCRYSTALS OF DIFFERING DENSITIES AND METHOD THEREFOR (75) Inventors: Sung-Taeg Kang, Austin, TX (US); Gowrishankar L. Chindalore, Austin, TX (US); Brian A. Winstead, Austin, TX (US); Jane A. Yater, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 215 days.

(21) Appl. No.: 13/362,697

(22) Filed: Jan. 31, 2012

(65) Prior Publication Data
US 2013/0193506 A1    Aug. 1, 2013

(51) Int. Cl.
*G11C 11/34* (2006.01)

(52) U.S. Cl.
USPC .......................................... 438/238; 365/159

(58) Field of Classification Search
USPC .................... 257/E21.194, E21.21, E21.337; 365/159; 438/238
See application file for complete search history.

(56) References Cited

U.S. PATENT DOCUMENTS

| | | | |
|---|---|---|---|
| 5,937,295 A | 8/1999 | Chen et al. | |
| 6,060,743 A | 5/2000 | Sugiyama et al. | |
| 6,808,986 B2 | 10/2004 | Rao et al. | |
| 7,550,802 B2 | 6/2009 | Koyanagi et al. | |
| 7,799,634 B2 | 9/2010 | Shen et al. | |
| 2004/0110338 A1* | 6/2004 | King | 438/238 |
| 2007/0105307 A1 | 5/2007 | Jeng | |
| 2009/0097320 A1* | 4/2009 | Min et al. | 365/185.18 |
| 2009/0189215 A1* | 7/2009 | Samanta et al. | 257/325 |
| 2012/0012919 A1 | 1/2012 | Kan et al. | |
| 2012/0264277 A1 | 10/2012 | Kang et al. | |
| 2012/0264282 A1 | 10/2012 | Kang et al. | |

OTHER PUBLICATIONS

Ohba, R., et al, "Nonvolatile Si Quantum Memory With Self-Aligned Doubly-Stacked Dots", IEEE Transactions on Electron Devices, IEEE Service Center, Pisacataway, NJ, U.S., vol. 49, No. 8, Aug. 1, 2002, pp. 1392-1398.
U.S. Appl. No. 13/085,238, Notice of Allowance Dated Aug. 8, 2012.
U.S. Appl. No. 13/085,230, Notice of Allowance Dated Aug. 6, 2012.
Hori, et al, "A MOSFET with Si-implanted Gate SiO2 Insulator for Nonvolatile Memory Applications", IEDM, 1992, pp. 17.7.1-17.7.4, IEEE.
Ohzone, et al., "Erase/Write Cycle Tests of n-MOSFET's with Si-Implanted Gate-SiO2", IEEE Transactions on Electron Devices; Sep. 1996, vol. 43, No. 9, IEEE.

(Continued)

*Primary Examiner* — Thomas L Dickey
(74) *Attorney, Agent, or Firm* — James L. Clingan, Jr.

(57) ABSTRACT

A method for forming a semiconductor device includes forming a first plurality of nanocrystals over a surface of a substrate having a first region and a second region, wherein the first plurality of nanocrystals is formed in the first region and the second region and has a first density; and, after forming the first plurality of nanocrystals, forming a second plurality of nanocrystals over the surface of the substrate in the second region and not the first region, wherein the first plurality of nanocrystals together with the second plurality of nanocrystals in the second region result in a second density, wherein the second density is greater than the first density.

20 Claims, 10 Drawing Sheets (56) References Cited

OTHER PUBLICATIONS

Zacharias, et al., "Size-Controlled Si Nanocrystals", 2006, 2 pg. abstract, Max Planck Institute for Microstructure Physics.
Lu, T.Z., et al., "Multilevel charge storage in silicon nanocrystal multilayers", Applied Physics Letters, Nov. 2005, pp. 44-45.
U.S. Appl. No. 13/085,238, Sung-Taeg Kang, et al., "Method for Forming a Semiconductor Device Having Nanocrystals", filed Apr. 12, 2011.

* cited by examiner

SEMICONDUCTOR DEVICE HAVING DIFFERENT NON-VOLATILE MEMORIES HAVING NANOCRYSTALS OF DIFFERING DENSITIES AND METHOD THEREFOR

CROSS-REFERENCE TO RELATED APPLICATIONS

This application is related to:

U.S. patent application Ser. No. 13/085,230, filed on Apr. 12, 2011, titled "METHOD FOR FORMING A SEMICONDUCTOR DEVICE HAVING NANOCRYSTALS," naming Sung-Taeg Kang and Jane Yater as inventors, and assigned to the current assignee hereof; and U.S. patent application Ser. No. 13/085,238, filed Apr. 12, 2011, titled "METHOD FOR FORMING A SEMICONDUCTOR DEVICE HAVING NANOCRYSTALS," naming Sung-Taeg Kang and Jane Yater as inventors, and assigned to the current assignee hereof.

BACKGROUND

1. Field

This disclosure relates generally to semiconductor processing, and more specifically, to a method for forming a semiconductor device having nanocrystals.

2. Related Art

Non-volatile data storage is commonly used in integrated circuits. In one type of semiconductor device structure used for non-volatile data storage, nanocrystals are used to store charge. The charge capturing capability of the nanocrystals is affected by the density, size, and distribution of the nanocrystals. Smaller nanocrystals may be formed more closely together to increase density. However, the closer spacing causes the nanocrystals to be more susceptible to leakage and physically touching neighboring nanocrystals, which may reduce performance. Also, smaller nanocrystals have reduced charge capacity as compared to larger nanocrystals. Larger nanocrystals are typically spaced further apart from each other as compared to smaller nanocrystals, allowing them to be less susceptible to leakage. However, the larger spacing results in larger regions of oxide between nanocrystals which may trap excess electrons during operation. This may result in reduced cycling endurance of the storage device.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a semiconductor device is made so as to result in a memory in which the charge storage layer has a first density of nanocrystals and another memory in which the charge storage layer has a second density of nanocrystals different from the first density.

Figure 1:
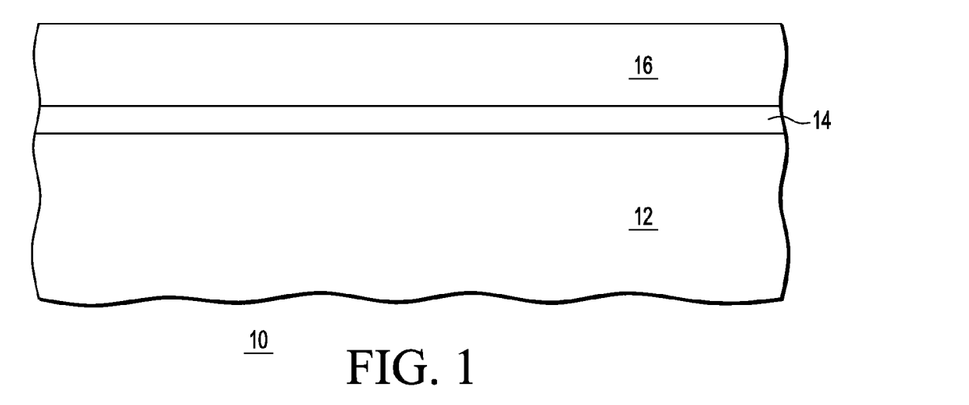
FIG. 1 illustrates a semiconductor device at a stage of processing in accordance with an embodiment of the present invention.

FIG. 1 illustrates a semiconductor device 10 after formation of a first insulating layer 14 over a surface of a semiconductor substrate 12, and a semiconductor layer 16 over first insulating layer 14. Semiconductor substrate 12 can be any semiconductor material or combinations of materials, such as gallium arsenide, silicon germanium, silicon-on-insulator (SOI), silicon, monocrystalline silicon, the like, and combinations of the above. First insulating layer 14 is formed over substrate 12, such as by growth or deposition, and a semiconductor layer 16 is deposited, such as by using chemical vapor deposition (CVD), over insulating layer 14. Semiconductor layer 16 may be a continuous or discrete film. In one embodiment, first insulating layer 14 includes an oxide and may also be referred to as a first dielectric layer or as a bottom dielectric layer. In one embodiment, semiconductor layer 16 includes a semiconductor material, such as silicon (e.g. amorphous silicon), germanium or the like. Alternatively, semiconductor layer 16 may include a metal.

Figure 2:
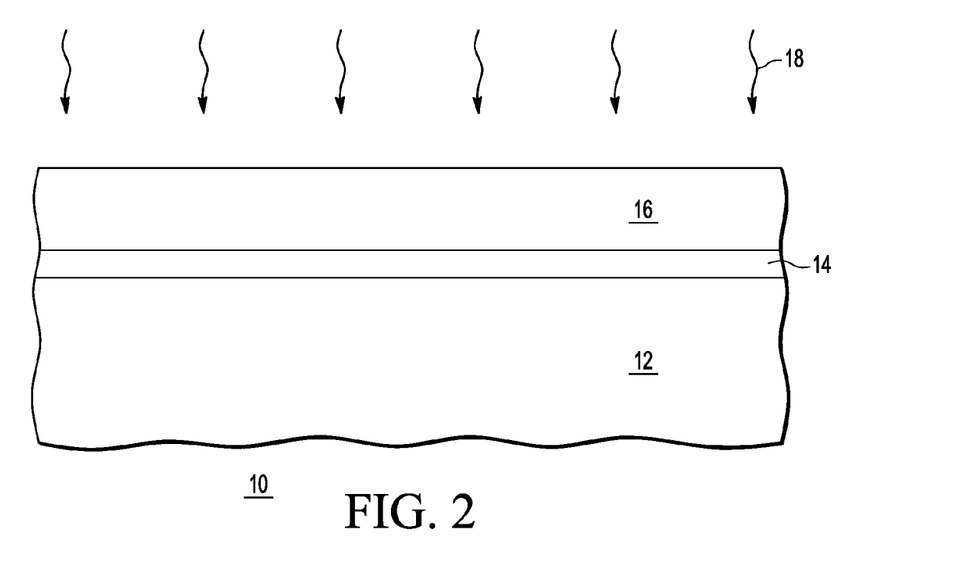
FIG. 2 illustrates the semiconductor device of FIG. 1 at a subsequent stage of processing in accordance with an embodiment of the present invention.
Figure 3:
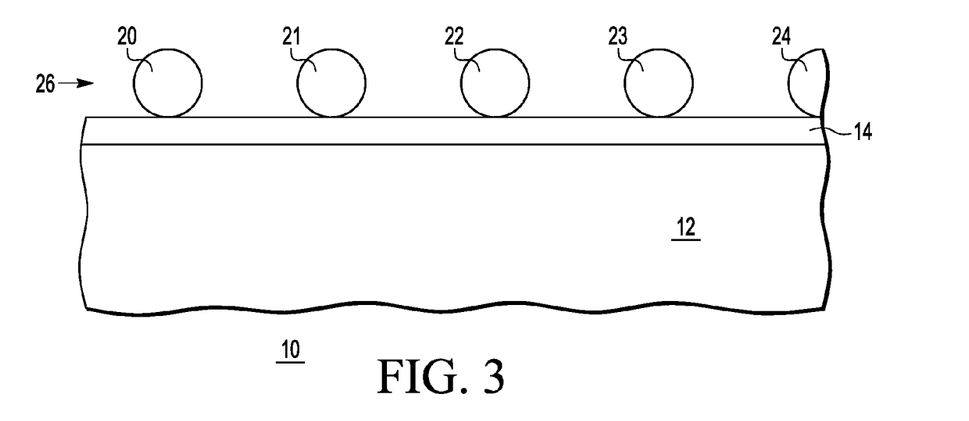
FIG. 3 illustrates the semiconductor device of FIG. 2 at a subsequent stage of processing in accordance with an embodiment of the present invention.

FIG. 2 illustrates semiconductor device 10 at a subsequent stage in processing in which an anneal 18 is performed. Semiconductor layer 16 is annealed to form a first plurality of nanocrystals 26 (as illustrated in FIG. 3). In one embodiment, the anneal is performed at a temperature in a range of approximately 600 to 950 degrees Celsius. In one embodiment, the anneal is performed at a temperature of approximately 750 degrees Celsius. As illustrated in FIG. 3, as a result of anneal 18, first plurality of nanocrystals 26, including nanocrystals 20-24, is formed over first insulating layer 14. In one embodiment, first plurality of nanocrystals 26 has an average diameter in a range of approximately 50 to 150 Angstroms.

Note that, in alternate embodiments, the steps of deposition of a semiconductor material (such as the CVD of semiconductor layer 16) followed by the anneal (such as anneal 18) can be repeated for a predetermined number of iterations to form the first plurality of nanocrystals 26. For example, in one embodiment, after anneal 18 of FIG. 2, another layer of semiconductor material may be deposited (such as by CVD) over the plurality of nanocrystals and another anneal performed, in order to increase the density and/or size of first plurality of nanocrystals 26. In yet another alternate embodiment, other methods may be used to form first plurality of nanocrystals 26. For example, in one embodiment, pre-formed nanocrystals may be deposited over first insulating layer 14. In another embodiment, a semiconductor material can be implanted into first insulating layer 14 and subsequently annealed to form first plurality of nanocrystals 26. In this embodiment, nanocrystals 20-24 may be surrounded by insulating material. Also, the subsequent anneal may be performed later in processing, such as when the source and drain regions of the device are annealed.

Figure 4:
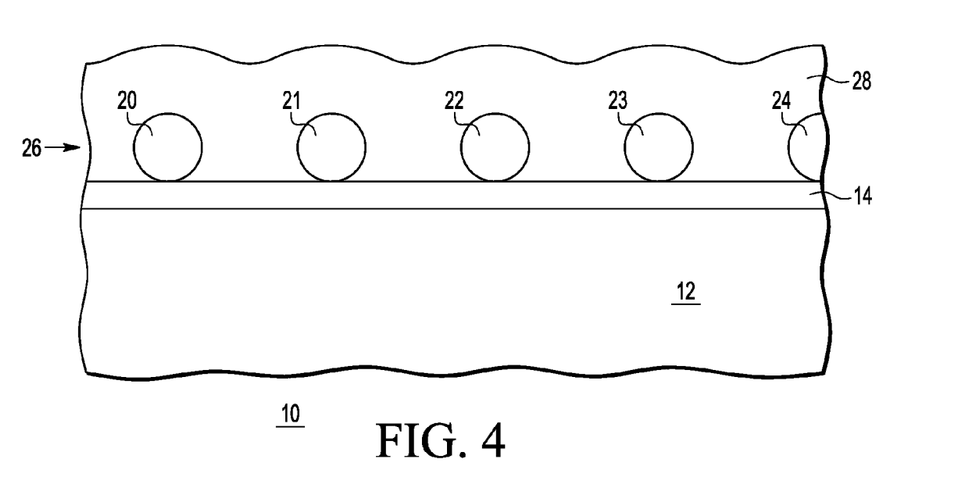
FIG. 4 illustrates the semiconductor device of FIG. 3 at a subsequent stage of processing in accordance with an embodiment of the present invention.

FIG. 4 illustrates semiconductor device 10 after formation of a second insulating layer 28 over first plurality of nanocrystals 26 (over nanocrystals 20-24). As illustrated in FIG. 4, after the formation of first plurality of nanocrystals 26 is complete, second insulating layer 28 may be formed, such as by deposition, over first plurality of nanocrystals 26. In one embodiment, second insulating layer 28 includes an oxide and may be referred to as a top dielectric layer.

Figure 5:
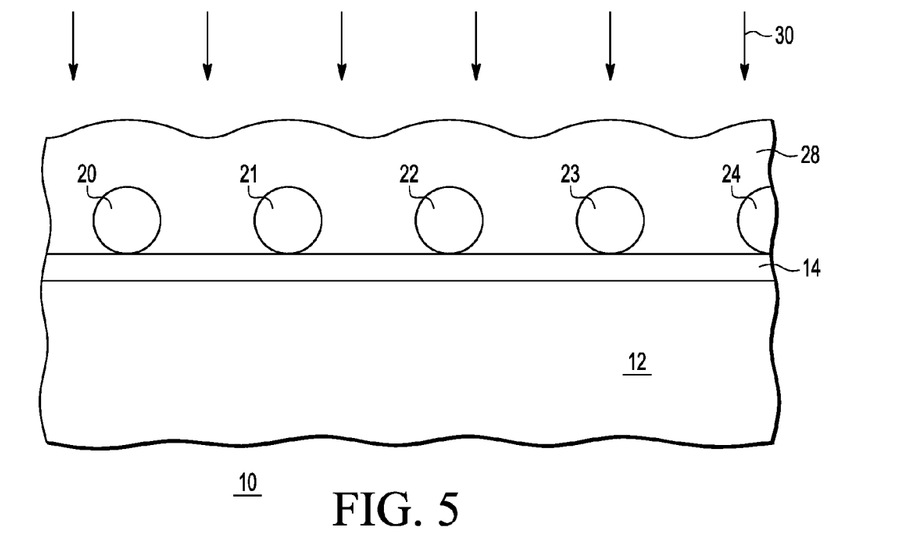
FIG. 5 illustrates the semiconductor device of FIG. 4 at a subsequent stage of processing in accordance with an embodiment of the present invention.

FIG. 5 illustrates semiconductor device 10 at a subsequent stage in processing in which an implant 30 is performed into second insulating layer 28. In one embodiment, the implant material used for implant 30 may include a semiconductor material, such as silicon, germanium, or the like, or may include a metal. In one embodiment, implant 30 is a shallow implant which is centered within second insulating layer 28 through control of implant energy and which does not extend into substrate 12.

Figure 6:
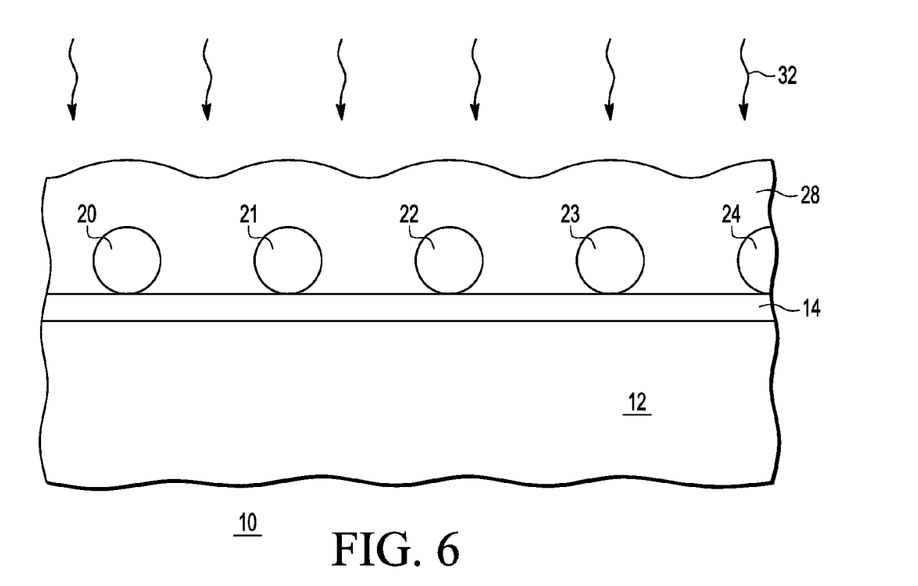
FIG. 6 illustrates the semiconductor device of FIG. 5 at a subsequent stage of processing in accordance with an embodiment of the present invention.
Figure 7:
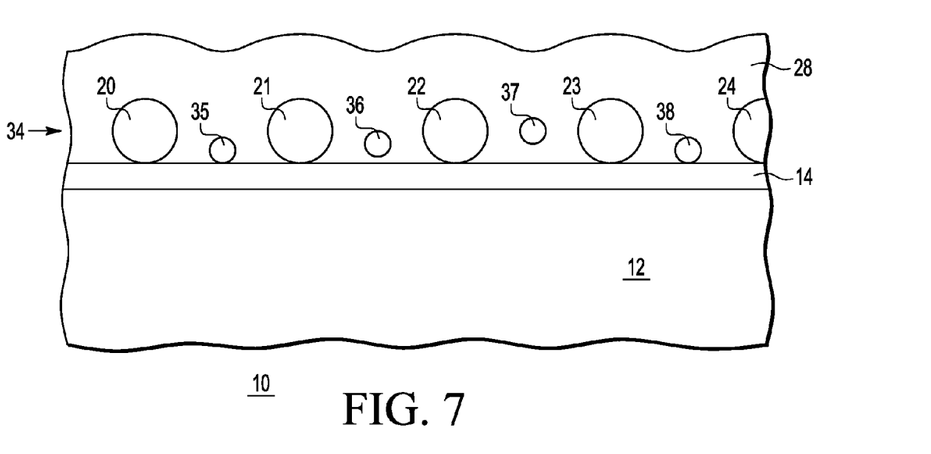
FIG. 7 illustrates the semiconductor device of FIG. 6 at a subsequent stage of processing in accordance with an embodiment of the present invention.

FIG. 6 illustrates semiconductor device 10 at a subsequent stage in processing in which an anneal 32 is performed. Therefore, after implant 30 is performed, the implant material is annealed to form a second plurality of nanocrystals, as illustrated in FIG. 7. For example, the anneal results in the implant material crystallizing to form nanocrystals made from the implant material. Therefore, as illustrated in FIG. 7, a second plurality of nanocrystals 34 is formed, which includes nanocrystals 35-38. Nanocrystals 35-38 are formed in regions of insulating material located between nanocrystals 20-23. Note that nanocrystals 35-38 may be formed at various different depths within second insulating layer 28, which can be controlled by implant conditions such as energy. In one embodiment, second plurality of nanocrystals 34 has an average diameter in a range of approximately 30 to 70 Angstroms. In one embodiment, the average diameter of second plurality of nanocrystals 34 is less than the average diameter of first plurality of nanocrystals 26. Also, in one embodiment, the first and second plurality of nanocrystals together provide a nanocrystal density greater than about 1e12 nanocrystals per square centimeter ($cm^2$).

Figure 8:
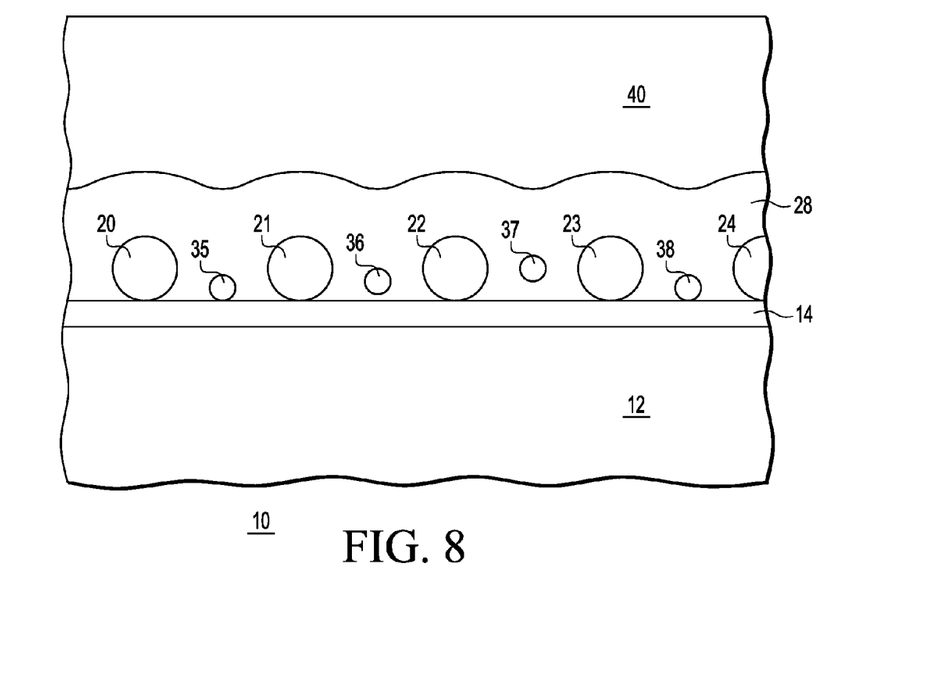
FIG. 8 illustrates the semiconductor device of FIG. 7 at a subsequent stage of processing in accordance with an embodiment of the present invention.

FIG. 8 illustrates semiconductor device 10 after formation of a semiconductor gate layer 40 over second insulating layer 28. In one embodiment, semiconductor gate layer 40 is a polysilicon layer.

Figure 9:
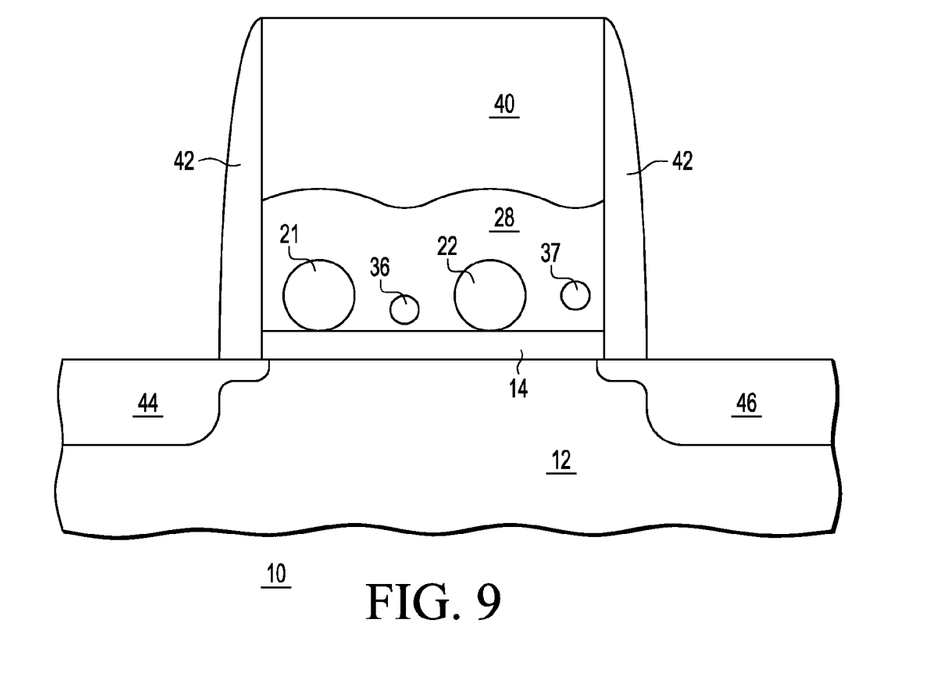
FIG. 9 illustrates the semiconductor device of FIG. 8 at a subsequent stage of processing in accordance with an embodiment of the present invention.

FIG. 9 illustrates semiconductor device 10 after patterning semiconductor gate layer 40 to form a gate stack, and after formation of a sidewall spacer 42 and source/drain regions 44 and 46. Semiconductor gate layer 40 is patterned to form a gate stack, in which the gate stack includes a portion of first insulating layer 14, a portion of first plurality of nanocrystals 26 (including, for example, nanocrystals 21 and 22) over the portion of first insulating layer 14, a portion of second plurality of nanocrystals 34 (including, for example, nanocrystals 36 and 37) over the portion of first insulating layer 14, a portion of second insulating layer 28 over the first and second pluralities of nanocrystals, and a portion of semiconductor gate layer 40 over the portion of second insulating layer 28. After the formation of the gate stack, sidewall spacer 42 may be formed surrounding the gate stack and source/drain regions 44 and 46 may be formed in substrate 12, laterally adjacent the sidewalls of the gate stack. Therefore, in one embodiment, semiconductor device 10 in FIG. 9 is a substantially completed semiconductor device which may be used, for example, as a non-volatile storage device in a non-volatile memory cell.

Note that the subsequent formation of the second plurality of nanocrystals (e.g. nanocrystals 36 and 37) after formation of the first plurality of nanocrystals reduces the open spaces of insulating material present between the nanocrystals of the first plurality of nanocrystals (e.g. nanocrystals 21 and 22). In this manner, a greater amount of charge can be stored within the nanocrystals (both the first and second plurality of nanocrystals), while reducing the amount of electrons that can get trapped in the insulating material between the nanocrystals. This may, for example, result in improved performance and improved cycle endurance of the memory cell. Furthermore, note that first plurality of nanocrystals 26 and second plurality of nanocrystals 34 may be formed of different materials.

Figure 10:
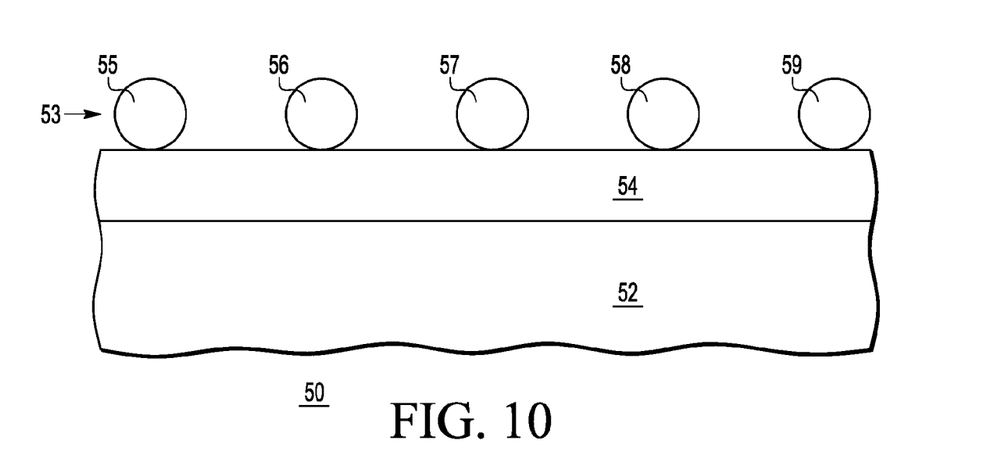
FIG. 10 illustrates a semiconductor device at a stage of processing in accordance with an embodiment of the present invention.

FIG. 10 illustrates a semiconductor device 50 after formation of a first insulating layer 54 over a surface of a semiconductor substrate 52, and a first plurality of nanocrystals 53 over first insulating layer 54. Semiconductor substrate 52 can be any semiconductor material or combinations of materials, such as gallium arsenide, silicon germanium, silicon-on-insulator (SOI), silicon, monocrystalline silicon, the like, and combinations of the above. In one embodiment, first insulating layer 54 includes an oxide and may also be referred to as a first dielectric layer or as a bottom dielectric layer. First plurality of nanocrystals 53 may include a semiconductor material, such as silicon or germanium or the like, or may include a metal. In one embodiment, first plurality of nanocrystals 53 (including nanocrystals 55-59) is formed over first insulating layer 54 as described above in reference to FIGS. 1-3 with respect to first plurality of nanocrystals 26. That is, for example, a layer of semiconductor material (such as amorphous silicon) may be deposited (such as by CVD) over first insulating layer 54 and an anneal may subsequently be performed (similar to anneal 18 described above). This deposition of a semiconductor material and subsequent anneal may also be repeated for a predetermined number of iterations, as needed, to form first plurality of nanocrystals 53. Alternatively, other methods may be used to form first plurality of nanocrystals 53. For example, pre-formed nanocrystals may be deposited over first insulating layer 54.

Figure 11:
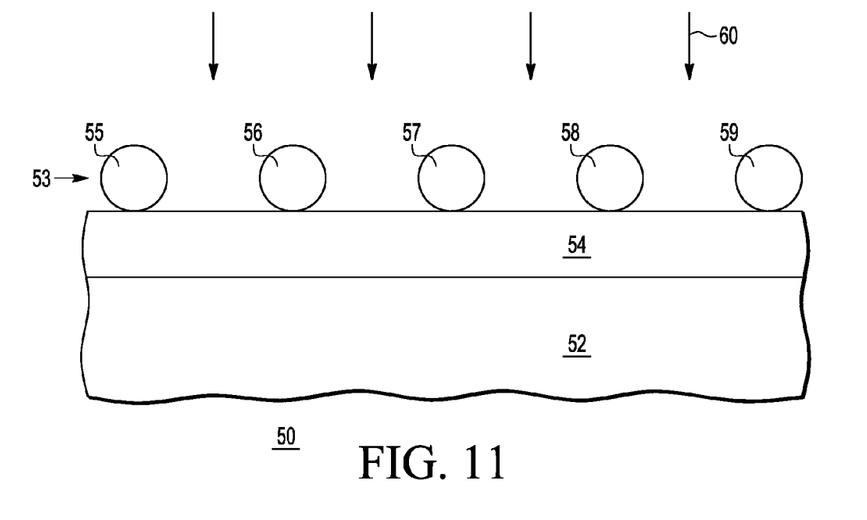
FIG. 11 illustrates the semiconductor device of FIG. 10 at a subsequent stage of processing in accordance with an embodiment of the present invention.

FIG. 11 illustrates semiconductor device 50 at a subsequent stage in processing in which an implant 60 is performed into first insulating layer 54 at a depth controlled by the implant energy. In one embodiment, the implant material used for implant 60 may include a semiconductor material, such as silicon, germanium, or the like, or may include a metal. In one embodiment, implant 60 is a shallow implant which does not extend into substrate 52. Also, note that the implant material for implant 60 may be a different material the material used to form first plurality of nanocrystals 53. Also, during implant 60, note that first plurality of nanocrystals 53, such as nanocrystals 55-59, act as masks during the implant such that the implant material ends up in regions of first insulating layer 54 located between nanocrystals and not directly beneath the nanocrystals.

Figure 12:
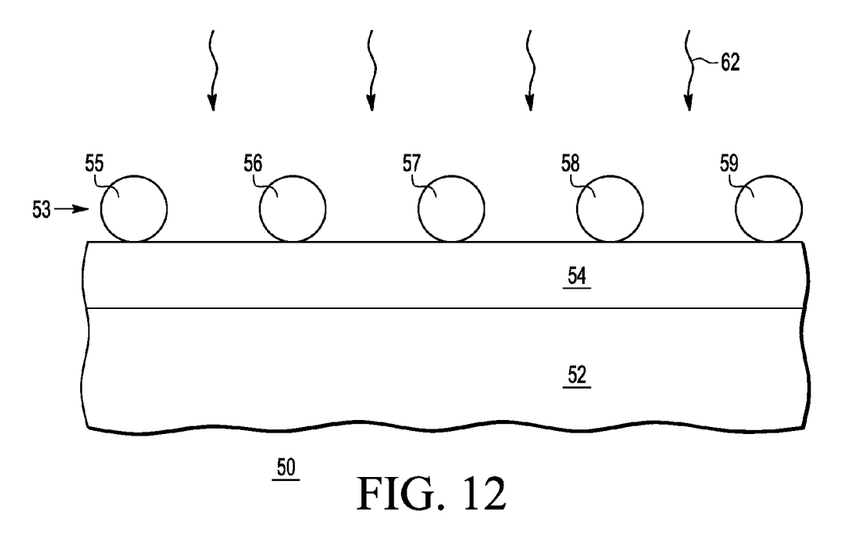
FIG. 12 illustrates the semiconductor device of FIG. 11 at a subsequent stage of processing in accordance with an embodiment of the present invention.
Figure 13:
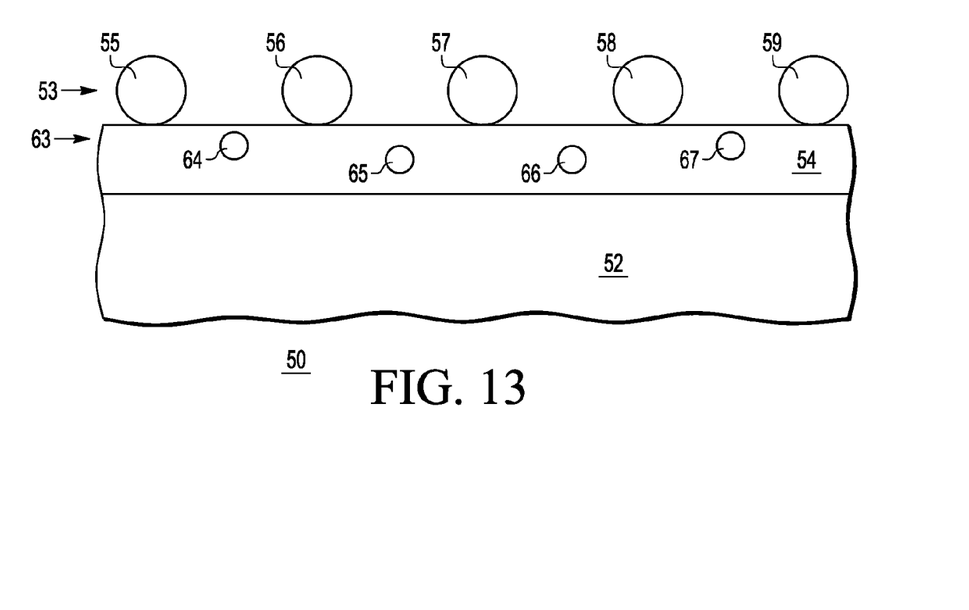
FIG. 13 illustrates the semiconductor device of FIG. 12 at a subsequent stage of processing in accordance with an embodiment of the present invention.

FIG. 12 illustrates semiconductor device 50 at a subsequent stage in processing in which an anneal 62 is performed. Therefore, after implant 60 is performed, the implant material is annealed to form a second plurality of nanocrystals, as illustrated in FIG. 13. For example, the anneal results in the implant material crystallizing to form nanocrystals made from the implant material. Therefore, as illustrated in FIG. 13, a second plurality of nanocrystals 63 is formed, which includes nanocrystals 64-67, within first insulating layer 54. Nanocrystals 64-67 are formed in regions of insulating material located between nanocrystals 55-59, since nanocrystals 55-59 acted as masks during implant 60, substantially preventing implant material from ending up beneath the nanocrystals themselves. Note that nanocrystals 64-67 may be formed at various different depths within first insulating layer 54. Also, note that second plurality of nanocrystals 63 is located under first plurality of nanocrystals 53 since they are located within a layer (first insulating layer 54) that is under first plurality of nanocrystals 53. In one embodiment, second plurality of nanocrystals 63 has an average diameter in a range of approximately 30 to 70 Angstroms. In one embodiment, the average diameter of second plurality of nanocrystals 63 is less than the average diameter of first plurality of nanocrystals 53. Also, in one embodiment, the first and second plurality of nanocrystals together provide a nanocrystal density greater than about 1e12 nanocrystals per square centimeter ($cm^2$).

Note that since first plurality of nanocrystals 53 operate as a mask during implant 60, the formation of first plurality of nanocrystals 53 by deposition may allow for improved control over formation and resulting density of first plurality of nanocrystals 53. In this manner, the nanocrystals of second plurality of nanocrystals 63 may be more likely to form in those regions of insulating material located between the nanocrystals of first plurality of nanocrystals 53 and not be located too close to the nanocrystals of first plurality of nanocrystals 53. Also, during implant 60, the nanocrystals of first plurality of nanocrystals 53 may increase in size depending on the implant material used for implant 60.

Figure 14:
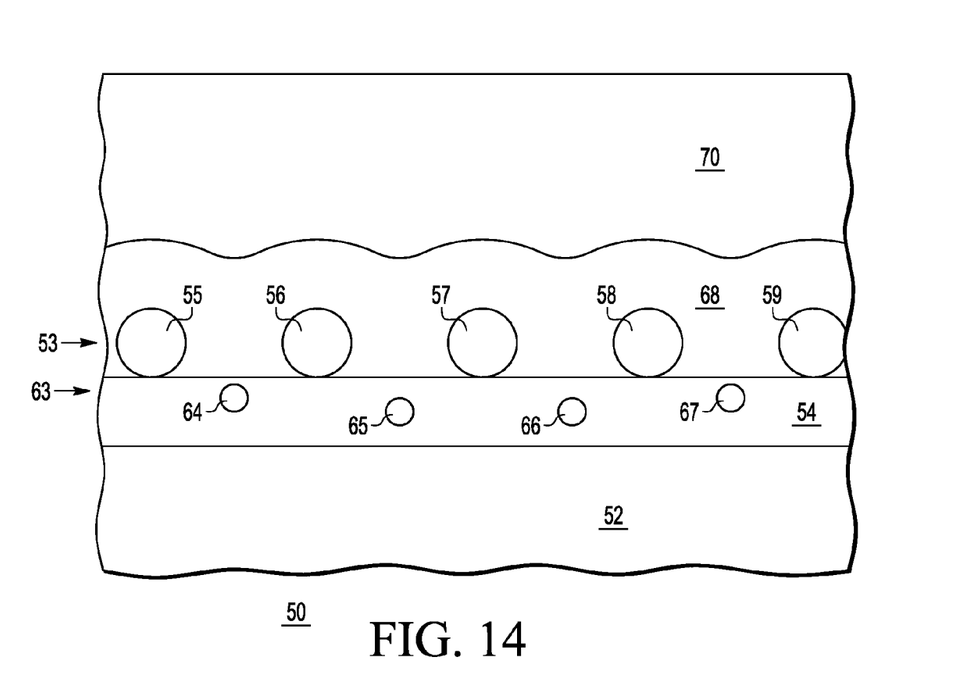
FIG. 14 illustrates the semiconductor device of FIG. 13 at a subsequent stage of processing in accordance with an embodiment of the present invention.

FIG. 14 illustrates semiconductor device 50 after formation of a second insulating layer 68 over first plurality of nanocrystals 53 (over nanocrystals 55-59) and after formation of a semiconductor gate layer 70 over second insulating layer 68. As illustrated in FIG. 14, after the formation of first plurality of nanocrystals 53 over first insulating layer 54 and the formation of second plurality of nanocrystals 63 within first insulating layer 54 are complete, second insulating layer 68 may be formed, such as by deposition, over first plurality of nanocrystals 53. In one embodiment, second insulating layer 68 includes an oxide and may be referred to as a top dielectric. Also, in one embodiment, semiconductor gate layer 70 is a polysilicon layer.

Figure 15:
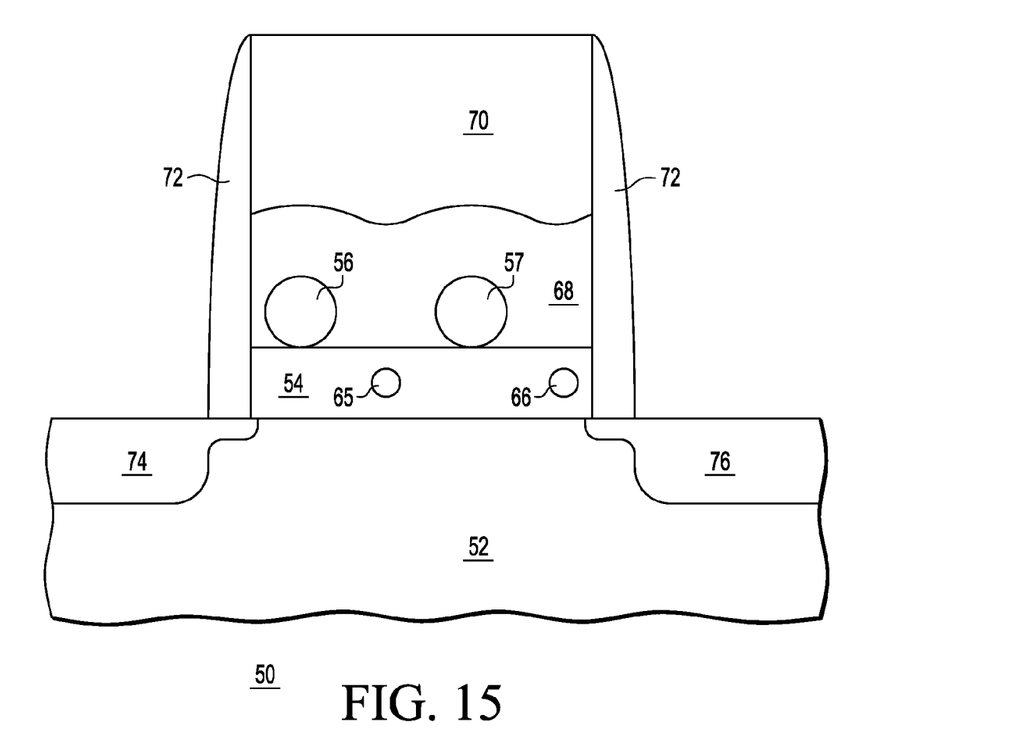
FIG. 15 illustrates the semiconductor device of FIG. 14 at a subsequent stage of processing in accordance with an embodiment of the present invention.

FIG. 15 illustrates semiconductor device 50 after patterning semiconductor gate layer 70 to form a gate stack, and after formation of a sidewall spacer 72 and source/drain regions 74 and 76. Semiconductor gate layer 70 is patterned to form a gate stack, in which the gate stack includes a portion of first insulating layer 54, a portion of second plurality of nanocrystals 63 (including, for example, nanocrystals 65 and 66) within first insulating layer 54, a portion of first plurality of nanocrystals 53 (including, for example, nanocrystals 56 and 57) over the portion of first insulating layer 54, a portion of second insulating layer 68 over the portion of first plurality of nanocrystals 53, and a portion of semiconductor gate layer 70 over the portion of second insulating layer 68. After the formation of the gate stack, sidewall spacer 72 may be formed surrounding the gate stack and source/drain regions 74 and 76 may be formed in substrate 22, laterally adjacent the sidewalls of the gate stack. Therefore, in one embodiment, semiconductor device 50 in FIG. 15 is a substantially completed semiconductor device which may be used, for example, as a non-volatile storage device in a non-volatile memory cell.

Note that the subsequent formation of the second plurality of nanocrystals (e.g. nanocrystals 65 and 66) after formation of the first plurality of nanocrystals reduces the open spaces of insulating material present between the nanocrystals of the first plurality of nanocrystals (e.g. nanocrystals 56 and 57). In this manner, a greater amount of charge can be stored within the nanocrystals (both the first and second plurality of nanocrystals), while reducing the amount of electrons that can get trapped in the insulating material between the nanocrystals. This may, for example, result in improved performance and improved cycle endurance of the memory cell. Furthermore, note that first plurality of nanocrystals 53 and second plurality of nanocrystals 63 may be formed of different materials.

Figure 16:
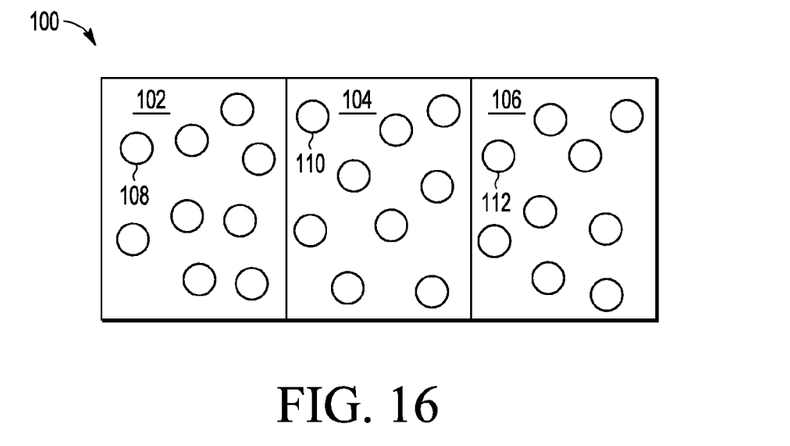
FIG. 16 is a top view of a semiconductor device at a stage in processing according to another embodiment.

Shown in FIG. 16 is a top view of a semiconductor device 100 having a region 102, a region 104, and a region 106. Regions 102 and 104 are for forming non-volatile memory devices using nanocrystals for charge storage. Region 106 is for forming transistors that may be logic transistors or other transistors that do not use nanocrystals. Regions 102, 104, and 106 are each continuous portions of a semiconductor substrate and may or may not be contiguous with each other. Region 102 has a charge storage layer which includes therein a plurality of nanocrystals in which a nanocrystal 108 is exemplary. Region 104 has a charge storage layer which includes therein a plurality of nanocrystals in which a nanocrystal 110 is exemplary. Similarly, region 106 has a charge storage layer which includes therein a plurality of nanocrystals in which a nanocrystal 112 is exemplary. The pluralities of nanocrystals may be formed in as shown in FIGS. 1-4. They could also be formed by another process. With the likely result of less dense and smaller nanocrystals, the implant process as shown in FIG. 5-7 or 11-13 could be used. The pluralities of nanocrystals represented by nanocrystals 108, 110, and 112 may be about 10 nanometers in diameter and have a density in which the nanocrystals have an average separation of about 5 nanometers.

Figure 17:
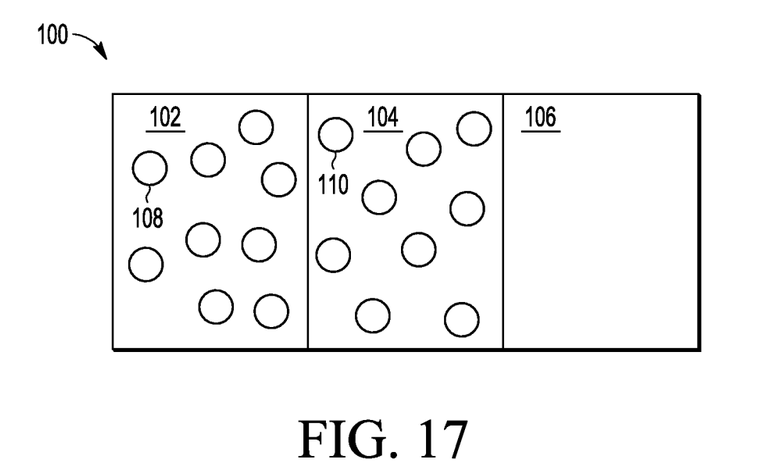
FIG. 17 is a top view of the semiconductor device of FIG. 16 at subsequent stage in processing.

Shown in FIG. 17 is semiconductor device 100 after removing from region 106 its plurality of nanocrystals. This prepares region 106 for formation of a transistor that does not include nanocrystals. Removing the plurality of nanocrystals in a logic region prior to patterning the nanocrystal in a non-volatile memory region is a common approach in forming non-volatile memories.

Figure 18:
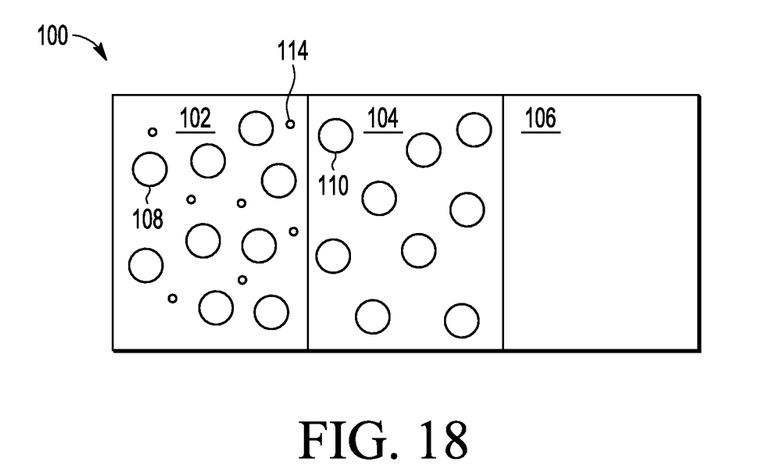
FIG. 18 is a top view of the semiconductor device of FIG. 17 at a subsequent stage in processing.

Shown in FIG. 18 is semiconductor device 100 after forming a second plurality of nanocrystals in region 102 in which a nanocrystal 114 is a representative one of the second plurality. The second plurality may be formed using the implant process shown in FIGS. 5-7 or 11-13. The second plurality represented by nanocrystal 114 is likely to have a lower density than the plurality of nanocrystals represented by nanocrystal 108 and also have an average size that may be a half that of the plurality represented by nanocrystal 108. Having both the plurality of nanocrystals as represented by nanocrystal 108 and the second plurality of nanocrystals as represented by nanocrystal 114, the density of nanocrystals in region 102 is significantly greater than that for region 104. Thus, region 102, having the higher density of nanocrystals is better for the situation in which endurance is relatively more important. In the case where data retention is relatively more important then region 104 is better. The nanocrystal density for region 102 should be at least 20 percent greater than for region 104.

Figure 19:
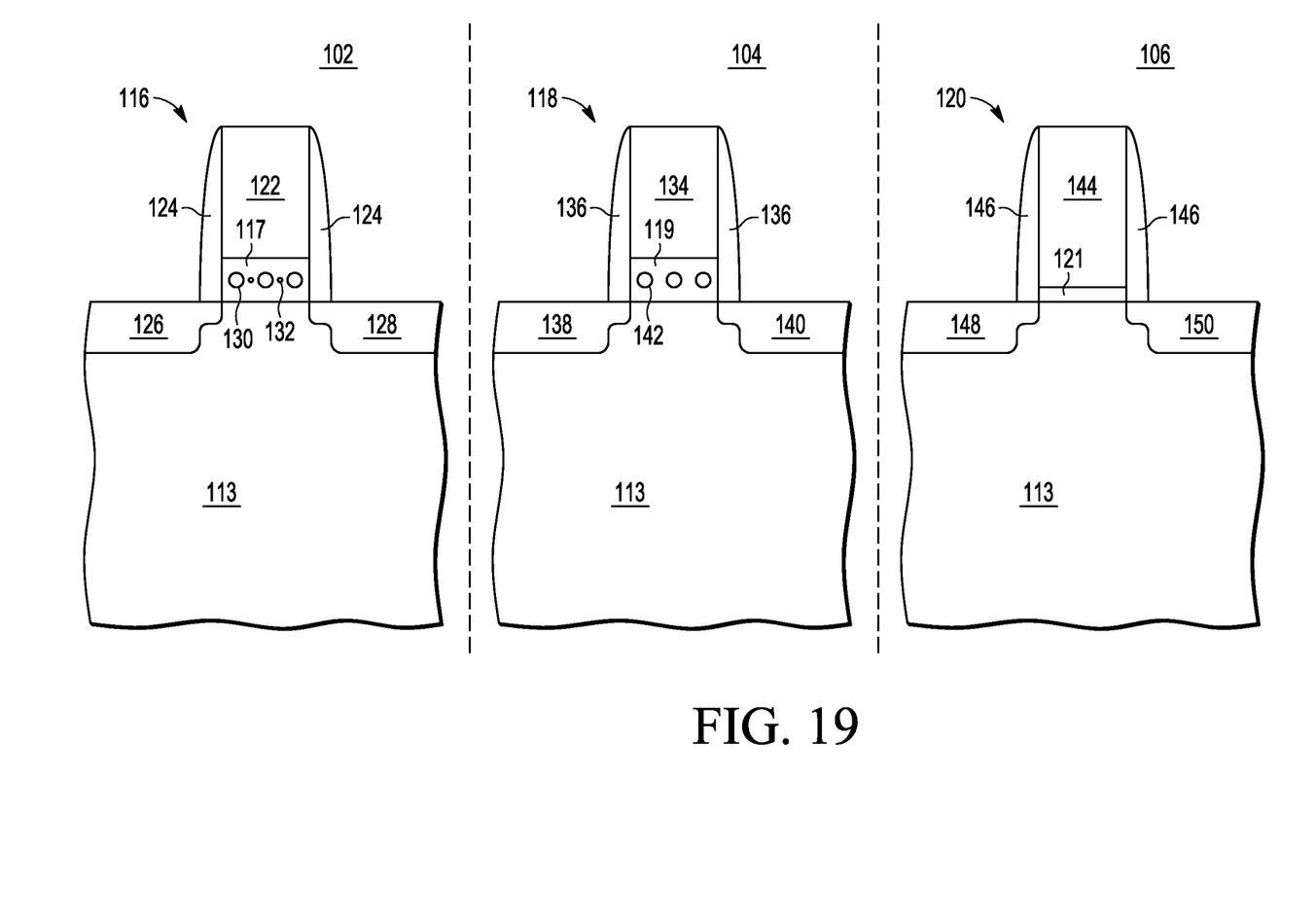
FIG. 19 is a top view of the semiconductor device of FIG. 18 at a subsequent stage in processing.

Shown in FIG. 19 is a non-volatile memory cell 116, a non-volatile memory cell 118, and a transistor 120, which may be a logic transistor. All of which may be formed by conventional processing after reaching the stage in processing shown in FIG. 18. Non-volatile memory cell 116 is formed in region 102 and has a gate 122, a sidewall spacer 124 around gate 122, a source/drain 126 formed in a substrate 113, and a source/drain region 128 formed in substrate 113. Over a region between source/drain regions 126 and 128 and between gate 122 and substrate 113 is a charge storage layer 117 that includes a plurality of nanocrystals, represented by nanocrystal 130, from the plurality of nanocrystals represented by nanocrystal 108 and a plurality of nanocrystals, represented by nanocrystal 132, from the second plurality of nanocrystals represented by nanocrystal 114. Non-volatile memory cell 118 is formed in region 104 and has a gate 134, a sidewall spacer 136 around gate 134, a source/drain 138 formed in a substrate 113, and a source/drain region 140 formed in substrate 113. Over a region between source/drain regions 138 and 140 and between gate 134 and substrate 113 is a charge storage layer 119 that includes a plurality of nanocrystals, represented by nanocrystal 142, from the plurality of nanocrystals represented by nanocrystal 110. Transistor 120 has a gate 144, a sidewall spacer 146 around gate 144, a source/drain region 148, a source/drain region 150, and a gate dielectric 121 between source/drain regions 148 and 150 and between substrate 113 and gate 144. Gate dielectric 121 may be relatively thin compared to charge storage layers 117 and 119. Charge storage layer 117, having both the relatively large and relatively small nanocrystals has a the higher density of nanocrystals than does charge storage layer 119, which has the lower density of nanocrystals, and thus non-volatile memory cell 116 has higher endurance and non-volatile memory cell 118 has higher data retention. It is believed that the reason for this is that endurance is degraded by high energy electrons passing between the nanocrystals and through the top dielectric, damaging the top dielectric. Higher density of nanocrystals reduces the occurrences of electrons passing between nanocrystals. With this reduction in such occurrences there is less damage to the top dielectric, improving endurance. On the other hand, extrinsic data retention is degraded by having the nanocrystals closer together causing internanocrystal charge leakage. Thus, the improvement in endurance by increasing nanocrystal density has the effect of reducing data retention.

Thus, on the same semiconductor device, non-volatile memories with different endurance and data retention characteristics. It is not uncommon for a semiconductor device to be called upon to perform functions where endurance is a relatively higher priority and other functions where data retention is a relatively high priority. In such case, the non-volatile memory can be divided into different regions where one region has higher data retention and another region has higher endurance. As an alternative the process shown in FIGS. 10-15 can be used so that the different nanocrystal types are in different charge storage layers.

By now it should be appreciated that there has been provided a method for forming a semiconductor device. The method includes forming a first plurality of nanocrystals over a surface of a substrate having a first region and a second region, wherein the first plurality of nanocrystals is formed in the first region and the second region and has a first density. The method includes after forming the first plurality of nanocrystals, forming a second plurality of nanocrystals over the surface of the substrate in the second region and not the first region, wherein the first plurality of nanocrystals together with the second plurality of nanocrystals in the second region result in a second density, wherein the second density is greater than the first density. The method may further comprise forming a first memory transistor in the first region, wherein the first memory transistor comprises a first charge storage layer, wherein the first charge storage layer includes a first portion of the first plurality of nanocrystals and forming a second memory transistor in the second region, wherein the second memory transistor comprises a second charge storage layer, wherein the second charge storage layer includes a second portion of the first plurality of nanocrystals and a portion of the second plurality of nanocrystals, wherein a nanocrystal density of the second charge storage layer is greater than a nanocrystal density of the first charge storage layer. The method may have a further characterization by which the nanocrystal density of the first charge storage layer corresponds a maximum nanocrystal density of memory transistors within the first region and the nanocrystal density of the second charge storage layer corresponds to a minimum nanocrystal density of memory transistors within the second region. The method may have a further characterization by which the step of forming the second plurality of nanocrystals includes forming an insulating layer over the substrate in the first region and the second region, implanting a material into the insulating layer, wherein the implanting is performed in the second region and not the first region, and annealing the material to form the second plurality of nanocrystals in the insulating layer. The method may have a further characterization by which the step of forming the insulating layer is performed such that the insulating layer is formed over the first plurality of nanocrystals. The method may have a further characterization by which forming the first plurality of nanocrystals comprises forming the first plurality of nanocrystals on the insulating layer prior to the step of implanting the material. The method may have a further characterization by which an average diameter of the first plurality of nanocrystals is greater than an average diameter of the second plurality of nanocrystals. The method may further include, prior to the step of forming the second plurality of nanocrystals, removing a portion of the first plurality of nanocrystals from a third region of the substrate, wherein the step of forming the second plurality of nanocrystals is performed such that the second plurality of nanocrystals is not formed in the third region and forming a logic transistor in the third region. The method may further include after the step of forming the second plurality of nanocrystals, removing a portion of each of the first plurality of nanocrystals and second plurality of nanocrystals from a third region of the substrate and forming a logic transistor in the third region.

Also is a method forming a semiconductor device including forming a first plurality of nanocrystals over a surface of a substrate having a first region and a second region, wherein the first plurality of nanocrystals is formed in the first region and the second region. The method may further include after forming the first plurality of nanocrystals, forming a second plurality of nanocrystals over the surface of the substrate in the second region and not the first region. The method may further include forming a first memory transistor in the first region, wherein the first memory transistor comprises a first charge storage layer, wherein the first charge storage layer includes a first portion of the first plurality of nanocrystals and has a first nanocrystal density. The method may further include forming a second memory transistor in the second region, wherein the second memory transistor comprises a second charge storage layer, wherein the second charge storage layer includes a second portion of the first plurality of nanocrystals and a portion of the second plurality of nanocrystals, wherein the second charge storage layer has a second nanocrystal density that is greater than the first nanocrystal density. The method may have a further characterization by which the step of forming the second plurality of nanocrystals includes forming an insulating layer over the substrate in the first region and the second region, implanting a material into the insulating layer, wherein the implanting is performed in the second region and not the first region, and annealing the material to form the second plurality of nanocrystals in the insulating layer. The method may have a further characterization by which the step of forming the insulating layer is performed such that the insulating layer is formed over the first plurality of nanocrystals. The method may have a further characterization by which forming the first plurality of nanocrystals comprises forming the first plurality of nanocrystals on the insulating layer prior to the step of implanting the material. The method may further include, prior to the step of forming the second plurality of nanocrystals, removing a portion of the first plurality of nanocrystals from a third region of the substrate, wherein the step of forming the second plurality of nanocrystals is performed such that the second plurality of nanocrystals is not formed in the third region and forming a logic transistor in the third region. The method may further include, after the step of forming the second plurality of nanocrystals, removing a portion of each of the first plurality of nanocrystals and second plurality of nanocrystals from a third region of the substrate and forming a logic transistor in the third region. The method may have a further characterization by which an average nanocrystal density of all devices in the second region is approximately 20% greater than an average nanocrystal density of all devices in the first region.

Disclosed also is a semiconductor device including a first plurality of memory transistors located in a first continuous region of a semiconductor substrate, wherein the first plurality of memory transistors comprises at least 1000 memory transistors, wherein each memory transistor of the first plurality of memory transistors comprises a charge storage layer having nanocrystals, and wherein the first plurality of memory transistors has a first average density of nanocrystals. The semiconductor device further includes a second plurality of memory transistors located in a second continuous region of the semiconductor substrate, separate from the first continuous region, wherein the second plurality of memory transistors comprises at least 1000 memory transistors, wherein each memory transistor of the second plurality of memory transistors comprises a charge storage layer having nanocrystals, and wherein the second plurality of memory devices has a second average density of nanocrystals that is at least 20% greater than the first average density. The semiconductor device may have a further characterization by which any memory transistor of the first plurality of memory transistors has an average nanocrystal density that is less than an average nanocrystal density of each memory transistor of the second plurality of memory transistors. The semiconductor device may have a further characterization by which within each memory transistor of the second plurality of memory transistors, the charge storage layer includes a dielectric layer over the semiconductor substrate in which a first portion of nanocrystals is located and a second portion of nanocrystals located on the dielectric layer. The semiconductor device may further include a plurality of logic transistors in a third region of the semiconductor substrate, wherein nanocrystals are not present the third region.

Although the invention is described herein with reference to specific embodiments, various modifications and changes can be made without departing from the scope of the present invention as set forth in the claims below. For example, a fourth region could be formed in which only nanocrystals from the second plurality of nanocrystals are used to form a non-volatile memory cell so there could be third category of non-volatile memory cells are formed. This could be achieved by forming, by implant, nanocrystals in a region in which the first formed nanocrystals were removed. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein. Furthermore, the terms "a" or "an," as used herein, are defined as one or more than one.

Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for forming a semiconductor device, comprising:
   forming a first plurality of nanocrystals over a surface of a substrate having a first region and a second region, wherein the first plurality of nanocrystals is formed in the first region and the second region and has a first density; and
   after forming the first plurality of nanocrystals, forming a second plurality of nanocrystals over the surface of the substrate in the second region and not the first region, wherein the first plurality of nanocrystals together with the second plurality of nanocrystals in the second region result in a second density, wherein the second density is greater than the first density.

2. The method of claim 1, further comprising:
   forming a first memory transistor in the first region, wherein the first memory transistor comprises a first charge storage layer, wherein the first charge storage layer includes a first portion of the first plurality of nanocrystals; and forming a second memory transistor in the second region, wherein the second memory transistor comprises a second charge storage layer, wherein the second charge storage layer includes a second portion of the first plurality of nanocrystals and a portion of the second plurality of nanocrystals, wherein a nanocrystal density of the second charge storage layer is greater than a nanocrystal density of the first charge storage layer.

3. The method of claim 2, wherein the nanocrystal density of the first charge storage layer corresponds a maximum nanocrystal density of memory transistors within the first region and the nanocrystal density of the second charge storage layer corresponds to a minimum nanocrystal density of memory transistors within the second region.

4. The method of claim 1, wherein the step of forming the second plurality of nanocrystals comprises:

forming an insulating layer over the substrate in the first region and the second region;

implanting a material into the insulating layer, wherein the implanting is performed in the second region and not the first region; and annealing the material to form the second plurality of nanocrystals in the insulating layer.

5. The method of claim 4, wherein the step of forming the insulating layer is performed such that the insulating layer is formed over the first plurality of nanocrystals.

6. The method of claim 4, wherein forming the first plurality of nanocrystals comprises forming the first plurality of nanocrystals on the insulating layer prior to the step of implanting the material.

7. The method of claim 1, wherein an average diameter of the first plurality of nanocrystals is greater than an average diameter of the second plurality of nanocrystals.

8. The method of claim 1, wherein prior to the step of forming the second plurality of nanocrystals, the method further comprises:

removing a portion of the first plurality of nanocrystals from a third region of the substrate, wherein the step of forming the second plurality of nanocrystals is performed such that the second plurality of nanocrystals is not formed in the third region; and forming a logic transistor in the third region.

9. The method of claim 1, further comprising:

after the step of forming the second plurality of nanocrystals, removing a portion of each of the first plurality of nanocrystals and second plurality of nanocrystals from a third region of the substrate; and forming a logic transistor in the third region.

10. A method for forming a semiconductor device, comprising:

forming a first plurality of nanocrystals over a surface of a substrate having a first region and a second region, wherein the first plurality of nanocrystals is formed in the first region and the second region;

after forming the first plurality of nanocrystals, forming a second plurality of nanocrystals over the surface of the substrate in the second region and not the first region;

forming a first memory transistor in the first region, wherein the first memory transistor comprises a first charge storage layer, wherein the first charge storage layer includes a first portion of the first plurality of nanocrystals and has a first nanocrystal density; and forming a second memory transistor in the second region, wherein the second memory transistor comprises a second charge storage layer, wherein the second charge storage layer includes a second portion of the first plurality of nanocrystals and a portion of the second plurality of nanocrystals, wherein the second charge storage layer has a second nanocrystal density that is greater than the first nanocrystal density.

11. The method of claim 10, wherein the step of forming the second plurality of nanocrystals comprises:

forming an insulating layer over the substrate in the first region and the second region;

implanting a material into the insulating layer, wherein the implanting is performed in the second region and not the first region; and annealing the material to form the second plurality of nanocrystals in the insulating layer.

12. The method of claim 11, wherein the step of forming the insulating layer is performed such that the insulating layer is formed over the first plurality of nanocrystals.

13. The method of claim 11, wherein forming the first plurality of nanocrystals comprises forming the first plurality of nanocrystals on the insulating layer prior to the step of implanting the material.

14. The method of claim 10, wherein prior to the step of forming the second plurality of nanocrystals, the method further comprises:

removing a portion of the first plurality of nanocrystals from a third region of the substrate, wherein the step of forming the second plurality of nanocrystals is performed such that the second plurality of nanocrystals is not formed in the third region; and forming a logic transistor in the third region.

15. The method of claim 10, further comprising:

after the step of forming the second plurality of nanocrystals, removing a portion of each of the first plurality of nanocrystals and second plurality of nanocrystals from a third region of the substrate; and forming a logic transistor in the third region.

16. The method of claim 10, wherein an average nanocrystal density of all devices in the second region is approximately 20% greater than an average nanocrystal density of all devices in the first region.

17. A semiconductor device, comprising:

a first plurality of memory transistors located in a first continuous region of a semiconductor substrate, wherein the first plurality of memory transistors comprises at least 1000 memory transistors, wherein each memory transistor of the first plurality of memory transistors comprises a charge storage layer having nanocrystals, and wherein the first plurality of memory transistors has a first average density of nanocrystals; and a second plurality of memory transistors located in a second continuous region of the semiconductor substrate, separate from the first continuous region, wherein the second plurality of memory transistors comprises at least 1000 memory transistors, wherein each memory transistor of the second plurality of memory transistors comprises a charge storage layer having nanocrystals, and wherein the second plurality of memory devices has a second average density of nanocrystals that is at least 20% greater than the first average density.

18. The semiconductor device of claim 17, wherein any memory transistor of the first plurality of memory transistors has an average nanocrystal density that is less than an average nanocrystal density of each memory transistor of the second plurality of memory transistors.

19. The semiconductor device of claim 17, wherein within each memory transistor of the second plurality of memory transistors, the charge storage layer comprises:
- a dielectric layer over the semiconductor substrate in which a first portion of nanocrystals is located; and
- a second portion of nanocrystals located on the dielectric layer.

20. The semiconductor device of claim 17, further comprising:
- a plurality of logic transistors in a third region of the semiconductor substrate, wherein nanocrystals are not present the third region.

* * * * *